(12) United States Patent
Kim

(10) Patent No.: US 9,592,584 B2
(45) Date of Patent: Mar. 14, 2017

(54) PLATE AND DUAL SIDE WAFER GRINDING DEVICE INCLUDING SAME

(71) Applicant: LG SILTRON INC., Gyeongsangbuk-do (KR)

(72) Inventor: Dae-Hoon Kim, Ulsan (KR)

(73) Assignee: LG SILTRON INC., Gyeongsangbuk-Do (KR)

( * ) Notice: Subject to any disclaimer, the term of this patent is extended or adjusted under 35 U.S.C. 154(b) by 0 days.

(21) Appl. No.: 14/761,930

(22) PCT Filed: Jan. 20, 2014

(86) PCT No.: PCT/KR2014/000564
§ 371 (c)(1),
(2) Date: Jul. 17, 2015

(87) PCT Pub. No.: WO2014/112845
PCT Pub. Date: Jul. 24, 2014

(65) Prior Publication Data
US 2015/0352684 A1 Dec. 10, 2015

(30) Foreign Application Priority Data
Jan. 18, 2013 (KR) .................. 10-2013-0006040

(51) Int. Cl.
*B24B 37/08* (2012.01)
*H01L 21/67* (2006.01)
*B24B 37/16* (2012.01)

(52) U.S. Cl.
CPC .............. *B24B 37/08* (2013.01); *B24B 37/16* (2013.01); *H01L 21/67092* (2013.01)

(58) Field of Classification Search
CPC ....... B24B 37/022; B24B 37/08; B24B 37/16; B24B 37/28
See application file for complete search history.

(56) References Cited

U.S. PATENT DOCUMENTS

| 5,645,469 A | 7/1997 | Burke et al. |
| 6,428,405 B1 * | 8/2002 | Tsuchiya ................ B24B 37/26 451/526 |

(Continued)

FOREIGN PATENT DOCUMENTS

| CN | 102729141 A | 10/2012 |
| JP | 58-51956 A | 3/1983 |

(Continued)

OTHER PUBLICATIONS

International Search Report, PCT/KR2014/000564, dated May 16, 2014 (4 pages).

(Continued)

*Primary Examiner* — Timothy V Eley
(74) *Attorney, Agent, or Firm* — Lewis Roca Rothgerber Christie LLP

(57) ABSTRACT

An embodiment of the present invention provides a surface plate provided at a wafer double-side grinding device for grinding a wafer. The surface plate includes a plurality of first surface plate grooves formed in a first direction, and a plurality of second surface plate grooves formed in a second direction different from the first direction. The first surface plate grooves and the second surface plate grooves have first and second surface plate groove portions arranged therein, the first and second surface plate groove portions having steps formed in a direction toward the center or an outer periphery of a lower surface plate.

14 Claims, 4 Drawing Sheets

(56) References Cited

U.S. PATENT DOCUMENTS

| | | | |
|---|---|---|---|
| 6,935,013 B1* | 8/2005 | Markevitch | B24B 37/042 216/88 |
| 2008/0064302 A1 | 3/2008 | Fujitani | |
| 2014/0170944 A1* | 6/2014 | Moudry | B24D 18/0009 451/540 |
| 2015/0298287 A1* | 10/2015 | Tsai | B24B 37/042 216/38 |

FOREIGN PATENT DOCUMENTS

| | | |
|---|---|---|
| JP | H 3-104558 A | 5/1991 |
| JP | H3-104558 A | 5/1991 |
| JP | 11-254297 A | 9/1999 |
| JP | 2001-291687 A | 10/2001 |
| JP | 2008-062367 A | 3/2008 |
| JP | 2009-248256 A | 10/2009 |
| JP | 2010-207934 A | 9/2010 |
| JP | 5853408 B2 | 2/2016 |

OTHER PUBLICATIONS

JP Office action dated Aug. 2, 2016 issued in corresponding Application No. 2015-553661, 4 pages.
SIPO Office action dated Jul. 4, 2016 issued in corresponding Application No. 201480016975.1, with English translation, 10 pages.
JP Office action dated Jul. 28, 2016 issued in corresponding Application No. 2015-553661, 4 pages.

* cited by examiner

PLATE AND DUAL SIDE WAFER GRINDING DEVICE INCLUDING SAME

BACKGROUND OF THE INVENTION

1. Field of the Invention

The present invention relates to a surface plate provided in a wafer double-side grinding device, and more particularly, to a surface plate of a wafer double-side grinding device for preventing slurry used in a double-side grinding process from being deposited on the surface plate, and a double-side grinding device including the same.

2. Description of the Related Art

In general, silicon wafers are manufactured through a slicing process in which a monocrystalline silicon ingot is sliced in a wafer shape, a lapping process in which the wafer is improved in flatness while being ground in a desired thickness, an etching process for removing a damage layer in the wafer, a polishing process for polishing a surface of the wafer to a mirror-like surface and improving flatness of the wafer, and a cleaning process for removing contaminants on the surface of the wafer.

To perform the lapping process on the wafer, a wafer carrier is disposed between an upper surface plate and a lower surface plate, and a wafer is disposed on the wafer carrier. Then, when the upper and lower surface plates rotate while continuously supplying slurry in which grinding particles, a dispersant, and a diluent, the surface of the wafer is ground by the grinding particles contained in the slurry. Generally, the main ingredients in abrasive materials are alumina or zirconia or silica. The abrasive material plays a major role in a double-side grinding process. Also, the dispersant is consist of a surfactant and amines. The dispersant may prevent re-aggregation between the particles of the abrasive material and precipitation of the particles of the abrasive material from occurring to allow the wafer to be smoothly ground.

Here, appropriate supply of the slurry that substantially grinds the wafer has significant effects on flatness of the wafer. Thus, a lattice-shaped groove for smoothly supplying and discharging the slurry is defined in a surface of each of the upper and lower surface plates to allow the slurry to be supplied and discharged therethrough.

The surface plate used in the practical lapping process has surfaces plate grooves that are spaced about 1 cm to about 4 cm apart from each other in transversal and longitudinal directions to allow the slurry to be easily discharged and supplied therethrough. However, since a bottom part of the surface plate groove parallelly defined in a horizontal direction, the slurry that is not discharged after being used in the wafer grinding process may be deposited in the surface plate groove in a sludge form. The accumulated sludge may interrupt the flow of the newly supplied slurry, and thus the particles for grinding the wafer may not smoothly circulate the wafer grinding device.

Due to the above-described limitation, to maintain a grinding force of the wafer double-side grinding device, a groove digging work for removing the sludge accumulated in the surface plate groove has to be performed regularly.

FIG. 1 is a view illustrating a shape of the surface plate groove and distribution of the slurry according to the related art. Referring to FIG. 1, in a cross-sectional view of a lower surface plate 12 according to the related art viewed from a lateral side, each of surface plate grooves 7 are defined in a predetermined depth. Also, since the slurry 5 is distributed in parallel with a bottom surface of the surface plate groove 7, the slurry 5 may not be easily distributed outside the lower surface plate 12. Also, when the slurry is deposited between the surface plate grooves 7, the wafer may be deteriorated in quality during the wafer double-side grinding process.

SUMMARY OF THE CLAIMED INVENTION

Technical Problem

An object of the present invention is to solve the above-described limitation and to provide a wafer double-side grinding device in which a lower surface plate has an improved structure so that slurry introduced into the lower surface plate via a carrier through a hole defined in an upper surface plate of the wafer grinding device easily circulates and is discharged when the wafer double-side grinding process is performed.

Another object of the present invention is to provide a wafer double-side grinding device in which slurry used in a wafer double-side grinding process is efficiently discharged, and thus a phenomenon in which a scratch is generated on the wafer due to the sludge during the wafer grinding process is prevented.

Technical Solution

A wafer double-side grinding device according to an embodiment of the present invention includes: an upper surface plate disposed above the wafer; a lower surface plate disposed under the wafer facing the upper surface plate; a carrier disposed between the upper and lower surface plates and to which the wafer is attached; and an internal gear disposed at an outer circumferential side of the lower surface plate and a sun gear disposed at an inner circumferential side of the lower surface plate, wherein a plurality of first surface plate grooves are defined in a top surface of the lower surface plate in a first direction, and a plurality of second surface plate grooves are defined in the top surface of the lower surface plate in a second direction different from the first direction, wherein, in the first and second surface plate grooves, first and second surface plate groove parts are defined, and each of the first and second surface plate grooves has a step difference toward a center or outer circumference of the lower surface plate.

Also, each of the first and second surface plate groove parts is a linear groove defined in the top surface of the lower surface plate in transversal and longitudinal directions. Each of the first and second surface plate groove parts is provided in plurality and arranged in the top surface of the lower surface plate in the transversal and longitudinal directions. Also, each of the first and second surface plate groove parts has a depth gradually increasing from an internal gear-side of the lower surface plate toward the sun gear.

Advantageous Effects

In the wafer double-side grinding device according to the present invention, the slurry that is the abrasive material sprayed to the upper and lower surface plates in the wafer grinding process may be easily discharged from the lower surface plate to reduce a phenomenon in which the slurry is deposited in the upper and lower surface plates, thereby improving the production yield of the wafer.

Also, when the wafer grinding process is performed, since the slurry is easily supplied and discharged in the wafer grinding device, the wafer may be improved in process uniformity.

Also, according to reduction of a deposited amount of slurry, scratch of the wafer due to the deposition of the slurry may be prevented, and thus the production yield of the wafer may be improved.

DETAILED DESCRIPTION

Hereinafter, specific embodiments will be described in detail with reference to the accompanying drawings. However, various additions, deletions, changes and modifications may be made thereto by one skilled in the art without departing from the scope and spirit of the invention as set forth in the appended claims.

Figure 1:
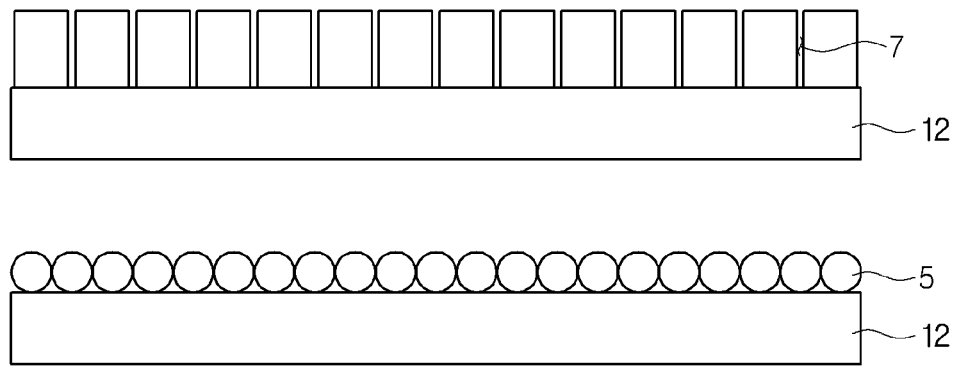
FIG. 1 is a view illustrating a section of a surface plate groove of a lower surface plate of the wafer double-side grinding device when viewed from a lateral side and slurry distributed on a bottom part of the surface plate groove according to the related art.
Figure 2:
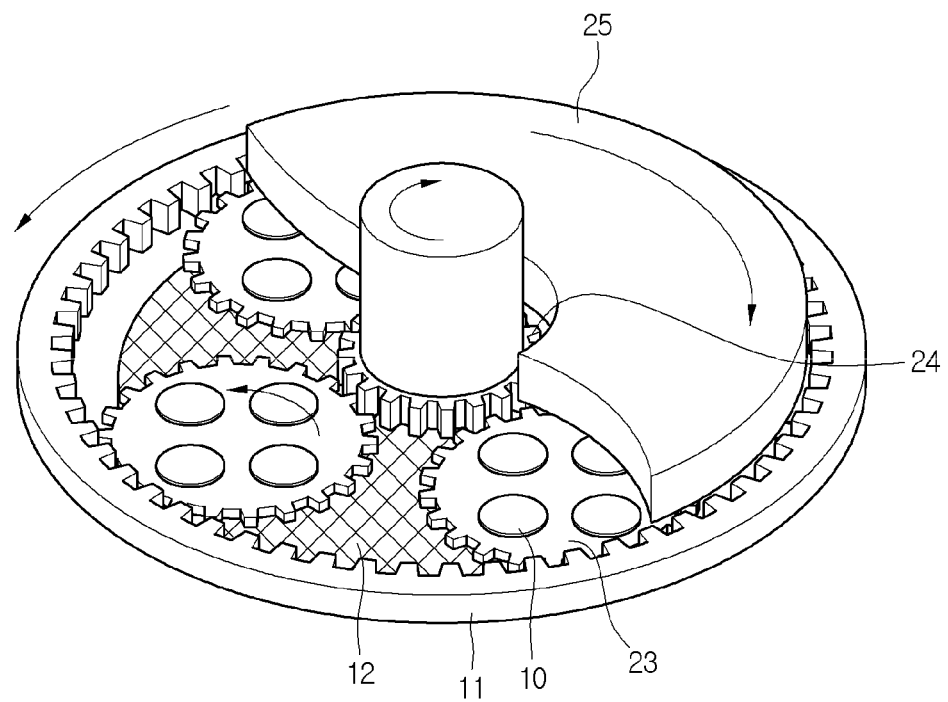
FIG. 2 is a perspective view of a wafer double-side grinding device according to an embodiment of the present invention.
Figure 3:
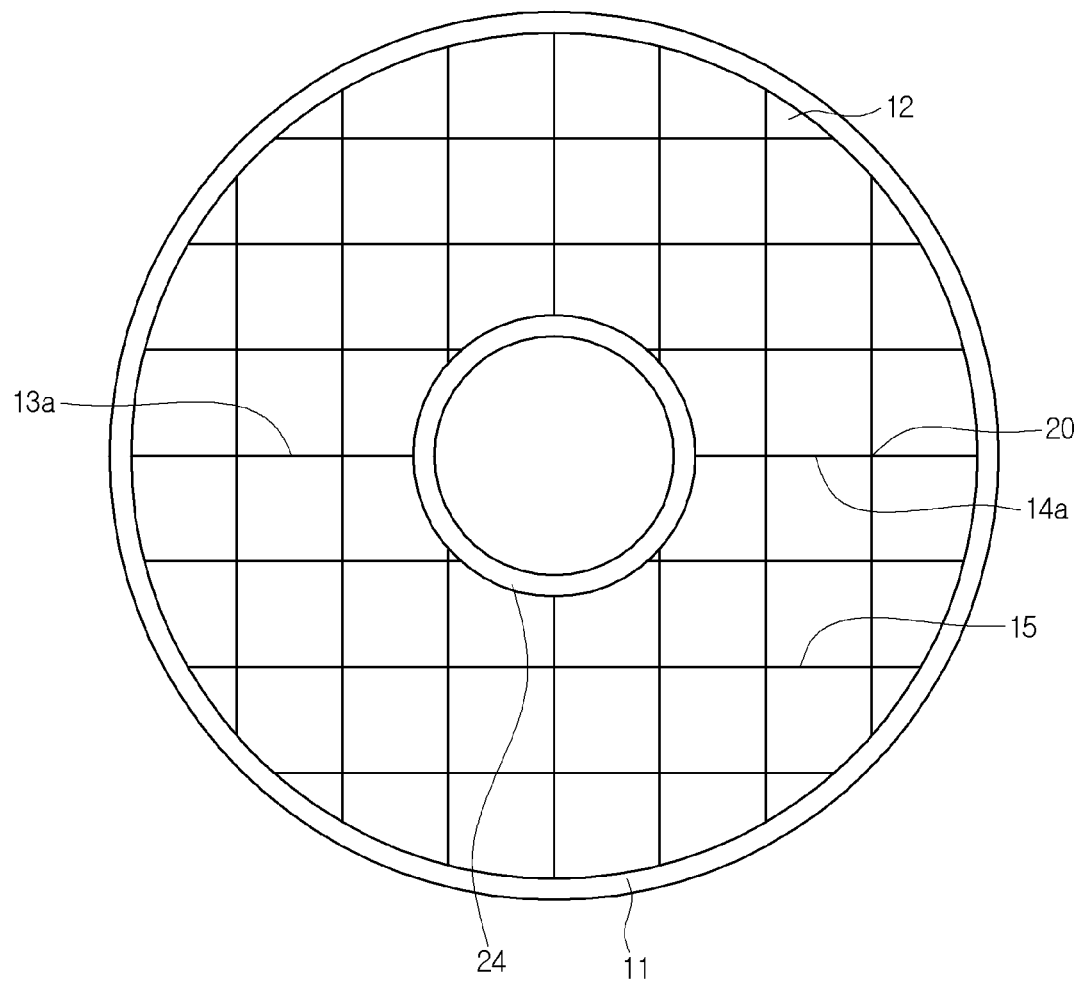
FIG. 3 is a plan view of the lower surface plate when viewed from above according to an embodiment of the present invention.

FIG. 2 is a view of a wafer double-side grinding device according to an embodiment of the present invention, and FIG. 3 is a plan view of a lower surface plate of the wafer double-side grinding device according to the embodiment of the present invention when viewed from above. The present invention provides a structure of a surface plate groove defined in the lower surface plate. The wafer double-side grinding device of the present invention will be described with reference to FIG. 2.

The wafer grinding device according to the present invention is mainly used in a lapping process for improving flatness of a wafer while grinding the wafer in a desired thickness and a polishing process for polishing a surface of the wafer and improving the flatness of the wafer, in a process for manufacturing the wafer used as a material for producing electronic parts such as semiconductors.

Referring to FIG. 2, like the related art, the wafer grinding device according to the current embodiment includes an upper surface plate 25, a lower surface plate 12, a sun gear 24, an internal gear 11, and a wafer carrier 23.

Each of the upper and lower surface plates 25 and 12 has a circular plate shape. The upper and lower surface plates 25 and 12 face each other. The upper surface plate 25 is elevatably disposed with respect to the lower surface plate 12. When a grinding process is performed, the upper surface plate 25 and the lower surface plate 12 may grind a wafer 10 while rotating in directions opposite to each other by a driving unit such as a motor.

The wafer carrier 23 is disposed between the sun gear 24 and the internal gear 11. The wafer carrier 23 may revolve around the sun gear 24 while rotating on its axis according to relative rotation of the sun gear 24 and the internal gear 11.

While the lapping process is performed, slurry in which an abrasive material, a dispersant, and a diluent are mixed is supplied between the upper surface plate 25 and the lower surface plate 12 to grind the surface of the wafer 10.

Referring to FIG. 3, a plurality of first surface plate groove parts each of which has a predetermined depth are defined in the lower surface plate 12 in a first direction that is a transversal direction. Also, a plurality of second surface plate groove parts each of which has a predetermined depth are spaced about 4 cm apart from each other in the lower surface plate 12 in a second direction that is a longitudinal direction. In description of the present invention, each of the surface plate grooves is a linear groove when viewed from a plane. The surface plate grooves are illustrated in a plurality of lines in the drawings. Also, the surface plate groove part represent a bottom part of the surface plate groove which is inclined. Also, since the lower surface plate has a circular shape, the first and second surface plate groove parts may have the constitution depending on the viewpoints. Thus, hereinafter the first surface plate groove part will be described, and the second surface plate groove part may be provided the same as the first surface plate groove part. Also, the first and second directions are directions different from each other, for example, the transversal or longitudinal direction.

Figure 4:
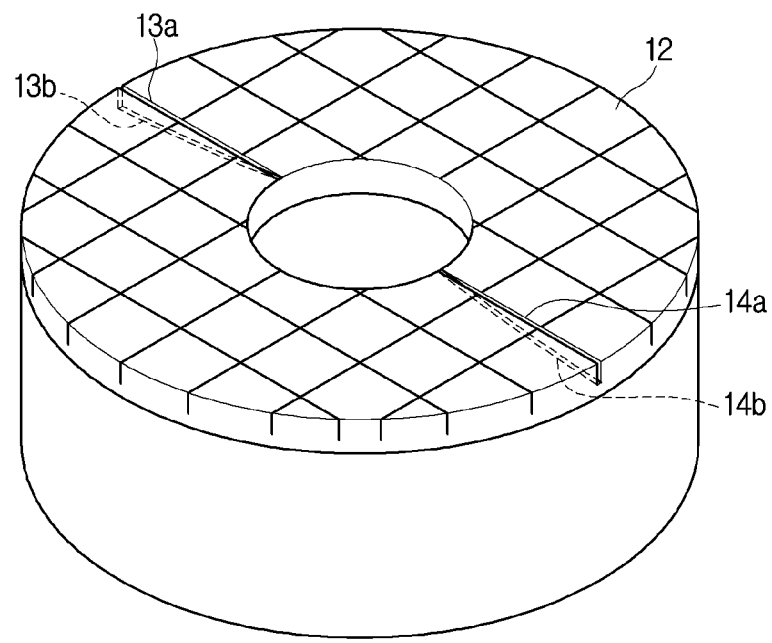
FIG. 4 is a perspective view of the lower surface plate of the wafer double-side grinding device according to an embodiment of the present invention.

FIG. 4 is a perspective view of the lower surface plate of the wafer double-side grinding device according to an embodiment of the present invention.

Referring to FIG. 4, the lower surface plate 12 has a circular plate shape. A circular penetration part is defined in a central portion of the lower surface plate 12 in a predetermined diameter to allow the sun gear 24 to be disposed therethrough. A plurality of surface plate grooves are defined in an area of the lower surface plate 12 except for the penetration part. Each of the plurality of surface plate grooves is defined in a predetermined direction. In the drawing, first surface plate grooves 13a and 14a are equally processed, and then the central portion of the lower surface plate is penetrated. The first surface plate grooves 13a and 14a are defined in positions corresponding to each other in the same direction.

Each of first surface plate groove parts 13b and 14b processed on the lower surface plate 12, which is a bottom part of each of the first surface plate grooves 13a and 14a, has an inclined part that is gradually inclined at a predetermined angle from the central portion of the lower surface plate toward an outer circumference of the lower surface plate. With respect to the center of the lower surface plate 12, the first surface plate groove part 14b that is the bottom part of the surface plate groove 14a corresponding to the first surface plate groove 13a is also inclined at a predetermined angle from the central portion of the lower surface plate toward the outer circumference of the lower surface plate. Although only the first surface plate grooves 13a and 14a each of which is a portion of the surface plate grooves are illustrated in the drawing, all of the surface plate grooves defined in the lower surface plate 12 may be defined the same as the first surface plate groove.

According to the lower surface plate having the above-described structure, when the wafer double-side grinding process is performed, the slurry introduced into the lower surface plate by rotation of the lower surface plate may be easily discharged to the outside of the lower surface plate while circulating in the lower surface plate by being affected by a centrifugal force. That is, rotational and gravitational forces may be simultaneously applied to the slurry due to the inclined surface of each of the first surface plate groove parts 13b and 14b to smoothly move the slurry.

Figure 5:
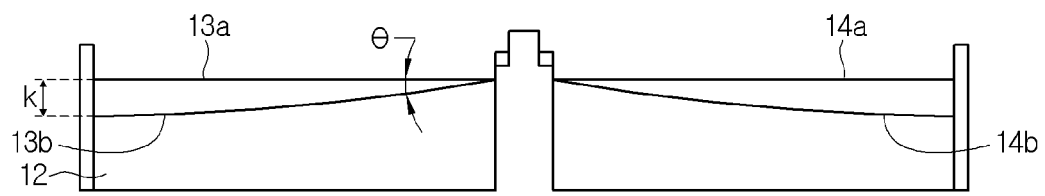
FIG. 5 is a cross-sectional view of the lower surface plate of the wafer double-side grinding device according to an embodiment of the present invention.

FIG. 5 is a cross-sectional view of the lower surface plate of the wafer double-side grinding device according to an embodiment of the present invention.

Referring to FIG. 5, the first surface plate groove part 13b is inclined at a predetermined angle θ with respect to the first surface plate groove 13a. In the present invention, although the first surface plate groove part 13b has an inclined angle of about 1° to about 10° with respect to the first surface plate groove 13a, it may be preferable that the first surface plate groove part 13b has an inclined angle of about 5° to about 10° with respect to the first surface plate groove 13a to discharge the slurry when the wafer double-side grinding process is performed.

Also, in the present invention, although a difference (hereinafter, referred to as a "step difference") K between the upper most portion of the first surface plate groove part 13b and the lower most portion of the first surface plate groove part 13b is about 1 cm to about 10 cm, it may preferable that the step difference K is about 5 cm to about 10 cm to easily discharge the slurry by forming the inclined angle θ between the first surface plate groove 13a and the first surface plate groove part 13b about 5° to about 10° as described above.

Figure 6:
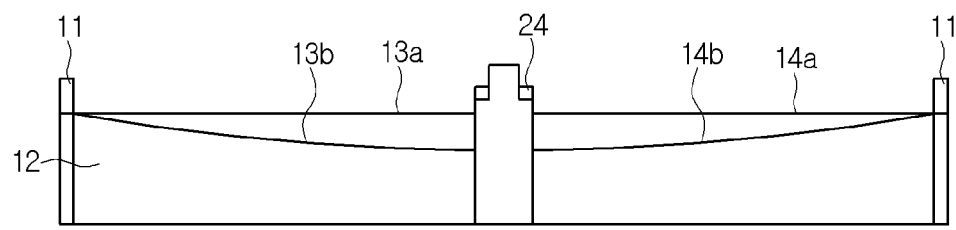
FIG. 6 is a cross-sectional view of a shape of a surface plate groove part according to an embodiment of the present invention.

FIG. 6 is a cross-sectional view of a shape of a surface plate groove part according to an embodiment of the present invention. Referring to FIG. 6, the first surface plate groove parts 13b and 14b that are bottom surfaces of the first surface plate grooves 13a and 14a when viewed from a plane may have the inclined parts that gradually inclined from the outer circumference of the lower surface plate toward the center of the lower surface plate.

Referring again to FIG. 3, it may be preferable that the first surface plate groove parts 13b and 14b are defined in the surface plate grooves in which the first surface plate grooves 13a and 14a are divided into two surface plate grooves by the sun gear 24 when viewed from the plane.

In the wafer grinding device according to the related art, the slurry supplied through the upper surface plate on the wafer moves to the lower surface plate under the wafer, and the slurry used for the grinding is deposited in the surface plate groove part of the lower surface plate and thus becomes sludge. However, according to the structure of the surface plate groove of the wafer double-side device suggested in the present invention, the slurry used for the grinding may flow down toward one end of the sun gear 24, that is, a direction in which the gravitational force is applied, to prevent the wafer from being deteriorated in quality caused by deposition of the abrasive material such as the slurry in the lower surface plate.

Also, as illustrated in FIG. 3, among the plurality of surface plate grooves defined in the first and second directions, the structure of a surface plate groove 15 that does not pass through the sun gear 24 will be described.

Figure 7:
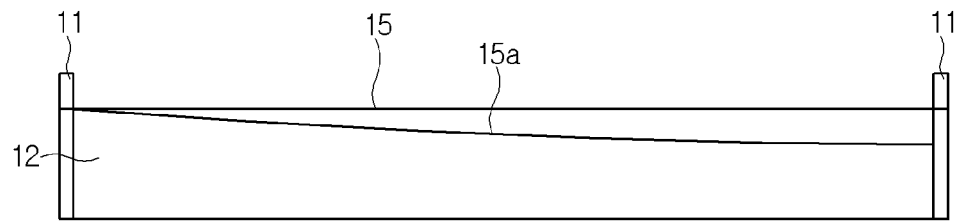
FIG. 7 is a cross-sectional view of a shape of a surface plate groove part according to an embodiment of the present invention.

Referring to FIG. 7, the first surface plate groove 15 according to current embodiment may have a first surface plate groove part 15a that is a bottom part thereof so that the first surface plate groove part 15a is gradually inclined at a predetermined angle toward the internal gear 11. Although the first surface plate groove part 15a is inclined toward the internal gear 11 at a right side in the drawing, the surface plate groove part 15a may be inclined in any direction.

Through the first surface plate groove part 15a having the above-described structure, the slurry used in the wafer grinding process may be easily discharged through one end of the surface plate groove at an internal gear-side while flowing along the inclined part due to the gravity.

Referring to FIG. 3, the surface plate groove part may be relatively steeply inclined in one direction of the first and second directions at a point 20 at which the first surface plate groove part defined in the first direction crosses the second surface plate groove part in the second direction different from the first direction. Thus, the slurry used in the wafer grinding may move along the first and second surface groove parts that are relatively steeply inclined at the point 20 at which the first and second surface plate groove parts cross each other and thus be discharged through the surface plate groove at a sun gear-side or the internal gear-side.

Figure 8:
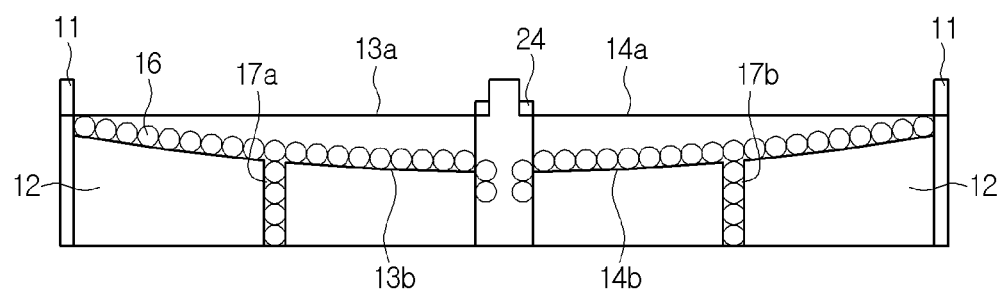
FIG. 8 is a cross-sectional view illustrating a state in which the slurry moves along a discharge hole of the surface plate groove part according to an embodiment of the present invention.
Figure 9:
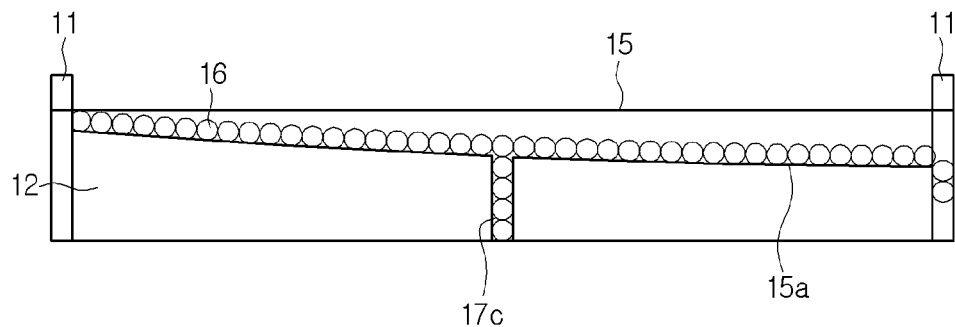
FIG. 9 is a cross-sectional view illustrating a state in which the slurry moves along a discharge hole of the surface plate groove part according to an embodiment of the present invention.

FIGS. 8 and 9 are views of another embodiments of the present invention.

Referring to FIG. 8, the surface plate grooves are defined in a predetermined distance in the lower surface plate 12 of the wafer grinding device in the first and second directions. The first surface plate groove parts 13b and 14b that are the bottom parts of the surface plate grooves at which one portion of the surface plate groove meets one portion of the sun gear 24 have inclined parts each of which is inclined at a predetermined part toward the sun gear 24. A discharge hole 17a having a predetermined size and passing through the lower surface plate is defined in a central portion of the first surface plate groove part 13b. Similarly, the first surface plate groove part 14b corresponding to the first surface plate groove part 13b with the sun gear 24 therebetween may have the inclined part that is inclined at a predetermined angle toward sun gear 24. Also, a discharge hole 17b having a predetermined size and passing through the lower surface plate may be defined in the central portion of the first surface plate groove part 14b.

Through the discharge holes 17a and 17b defined in the first surface plate groove parts 13b and 14b, the slurry 16 used in the wafer grinding process may be discharged through the discharge holes 17a and 17b while flowing toward the sun gear 24 along the inclined parts of the first surface plate groove parts 13b and 14b due to the gravity. Here, the slurry that is not discharged may be easily discharged at the one end of the surface plate groove part at the sun gear-side along the inclined part.

FIG. 9 is a view illustrating a structure of the surface plate groove defined in first and second directions which does not pass through a portion of the sun gear 24.

Referring to FIG. 9, the first surface plate groove part 15a in the lower surface plate 12 may be inclined at a predetermined angle toward one end of the internal gear 11. A discharge hole 17c having a predetermined size and passing through the lower surface plate 12 may be defined in a central portion of the inclined surface. Thus, the grinding particles and slurry 16 used in the wafer grinding process may be discharged through the discharge hole 17c along the inclined surface due to the gravity. Here, the slurry 16 that is not discharged may be discharged at one end of the surface plate groove part meeting the one end of the internal gear 11.

The discharge holes 17a, 17b, and 17c of the surface plate groove parts having the above-described structures may improve a discharge speed of the slurry that is the abrasive material used in the wafer grinding process and maximize a circulation effect in which the slurry is supplied into and discharged from the lower surface plate to improve a process yield of the wafer.

In the wafer double-side grinding device according to the present invention, the slurry that is the abrasive material sprayed to the upper and lower surface plates in the wafer grinding process may be easily discharged from the lower surface plate to reduce a phenomenon in which the slurry is deposited in the upper and lower surface plates, and according to reduction of a deposited amount of slurry, scratch of the wafer may be prevented, to improve a production yield of the wafer.

The detailed description may be amended or modified according to viewpoints and applications, not being out of the scope, technical idea and other objects of the present invention. Also, it is intended that the present invention covers the modifications and variations of this invention provided they come within the scope of the appended claims and their equivalents.

INDUSTRIAL APPLICABILITY

The present invention has industrial applicability in that the surface plate groove define din the lower surface plate of the surface plate provided in the wafer double-side grinding device has a structure to allow the slurry to be easily discharged.

What is claimed is:

1. A wafer double-side grinding device for grinding a wafer, the device comprising:
    an upper surface plate disposed above the wafer;
    a lower surface plate disposed under the wafer facing the upper surface plate;
    a carrier disposed between the upper and lower surface plates and to which the wafer is attached;
    an internal gear disposed at an outer circumferential side of the lower surface plate; and
    a sun gear disposed at an inner circumferential side of the lower surface plate,
    wherein a plurality of first surface plate grooves are defined in a top surface of the lower surface plate in a first direction, and a plurality of second surface plate grooves are defined in the top surface of the lower surface plate in a second direction different from the first direction, and
    wherein, in the first and second surface plate grooves, first and second surface plate groove parts are defined, and each of the first and second surface plate grooves has a step difference toward a center or outer circumference of the lower surface plate.

2. The device of claim 1, wherein each of the first and second surface plate grooves is a linear groove defined in the top surface of the lower surface plate, wherein the first direction is a transversal direction, and wherein the second direction is a longitudinal direction.

3. The device of claim 1, wherein the first surface plate groove part is provided in plurality, and the plurality of first surface plate groove parts are arranged in the top surface of the lower surface plate in a transversal direction, and
    each of the first surface plate groove parts has a depth gradually increasing from the sun gear of the lower surface plate toward the internal gear.

4. The device of claim 1, wherein the second surface plate groove part is provided in plurality, and the plurality of second surface plate groove parts are arranged in the top surface of the lower surface plate in a longitudinal direction,
    each of and the second surface plate groove parts has a depth gradually increasing from the sun gear of the lower surface plate toward the internal gear.

5. The device of claim 1, wherein each of the first and second surface plate groove parts has an inclined angle of about 5° to about 10° with respect to the top surface of the lower surface plate.

6. The device of claim 1, wherein each of the first and second surface plate groove parts has a step difference of about 5 cm to about 10 cm with respect to the top surface of the lower surface plate.

7. The device of claim 1, wherein slurry used for grinding the wafer is discharged through each of the first and second surface plate groove p-r-ats parts at a sun gear-side by an inclination of each of the first and second surface plate groove parts.

8. The device of claim 1, wherein each of the first and second surface plate groove parts further comprises a discharge hole having a predetermined size in a central portion thereof.

9. The device of claim 8, wherein a portion of slurry used for grinding the wafer is discharged through the discharge hole while flowing toward the sun gear, and the slurry that is not discharged is discharged through each of the first and second surface plate groove parts at a sun gear-side.

10. The device of claim 1, wherein a plurality of the first and second surface plate groove parts do not pass through the sun gear, and wherein each of the first and second surface plate groove parts that does not pass through the sun gear has a sloping part inclined toward any one of an internal gear-side or a sun gear-side.

11. The device of claim 10, wherein slurry used for grinding the wafer is discharged through each of the first and second surface groove parts at an internal gear-side by the sloped.

12. The device of claim 10, wherein a slurry moves to a position having a relatively large inclined angle at a point at which the first and second surface plate groove parts cross each other and is discharged through each of the first and second surface plate groove parts at an internal gear-side or a sun gear-side.

13. A lower surface plate provided in a wafer double-side grinding device, the lower surface plate comprising:
    a plurality of first surface plate grooves defined in a top surface of the lower surface plate in a first direction; and
    a plurality of second surface plate grooves defined in the top surface of the lower surface plate in a second direction different from the first direction,
    wherein, in the first and second surface plate grooves, first and second surface plate groove parts are defined, and each of the first and second surface plate grooves has a step difference toward a center or outer circumference of the lower surface plate.

14. The lower surface plate of claim 13, wherein each of the first and second surface plate groove parts has an inclined part having a predetermined angle with respect to the top surface of the lower surface plate and a discharge hole for discharging slurry in a central portion thereof.

* * * * *